(12) United States Patent
Gross et al.

(10) Patent No.: US 9,076,635 B2
(45) Date of Patent: Jul. 7, 2015

(54) SUBSTRATE TREATMENT INSTALLATION

(75) Inventors: Harald Gross, Langebrueck (DE); Erwin Zschieschang, Dresden (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 94 days.

(21) Appl. No.: 14/113,472

(22) PCT Filed: Apr. 27, 2012

(86) PCT No.: PCT/EP2012/057765
§ 371 (c)(1),
(2), (4) Date: Oct. 23, 2013

(87) PCT Pub. No.: WO2012/146715
PCT Pub. Date: Nov. 1, 2012

(65) Prior Publication Data
US 2014/0070689 A1    Mar. 13, 2014

(30) Foreign Application Priority Data

Apr. 29, 2011 (DE) .......................... 10 2011 100 098
Aug. 29, 2011 (DE) .......................... 10 2011 081 749

(51) Int. Cl.
*H01J 1/02* (2006.01)
*H01J 37/32* (2006.01)
*H01L 21/67* (2006.01)
*H01J 7/26* (2006.01)

(52) U.S. Cl.
CPC ..... *H01J 37/32522* (2013.01); *H01L 21/67115* (2013.01); *H01J 7/26* (2013.01)

(58) Field of Classification Search
CPC .................................................. H01L 21/67115
USPC ................................................. 313/11, 17, 25
See application file for complete search history.

(56) References Cited

U.S. PATENT DOCUMENTS

| 6,631,726 | B1 * | 10/2003 | Kinoshita et al. .......... 134/102.1 |
| 2002/0148824 | A1 | 10/2002 | Hauf et al. |
| 2003/0094446 | A1 | 5/2003 | Tay et al. |
| 2007/0095289 | A1 | 5/2007 | Arami |

FOREIGN PATENT DOCUMENTS

| DE | 1910505 U | 2/1965 |
| DE | 19631188 A1 | 2/1998 |
| EP | 0 822 577 A2 | 2/1998 |

(Continued)

OTHER PUBLICATIONS

National Examination Report dated Sep. 20, 2013 for corresponding German application No. 10 2011 081 749.2.

(Continued)

*Primary Examiner* — Vip Patel
(74) *Attorney, Agent, or Firm* — Heslin Rothenberg Farley & Mesiti P.C.

(57) ABSTRACT

A substrate treatment installation includes an installation chamber and a light source for the exposure of substrates to light. The light source is arranged in the interior of the substrate treatment installation and includes at least one discharge lamp arranged in a housing, which is permeable to light at least in sections and has a vacuum-tight cavity for accommodating the lamp, and also at least one reflector element arranged in spatial proximity to the at least one lamp and having an electrical connection.

8 Claims, 4 Drawing Sheets

(56) References Cited

FOREIGN PATENT DOCUMENTS

Figure 1:
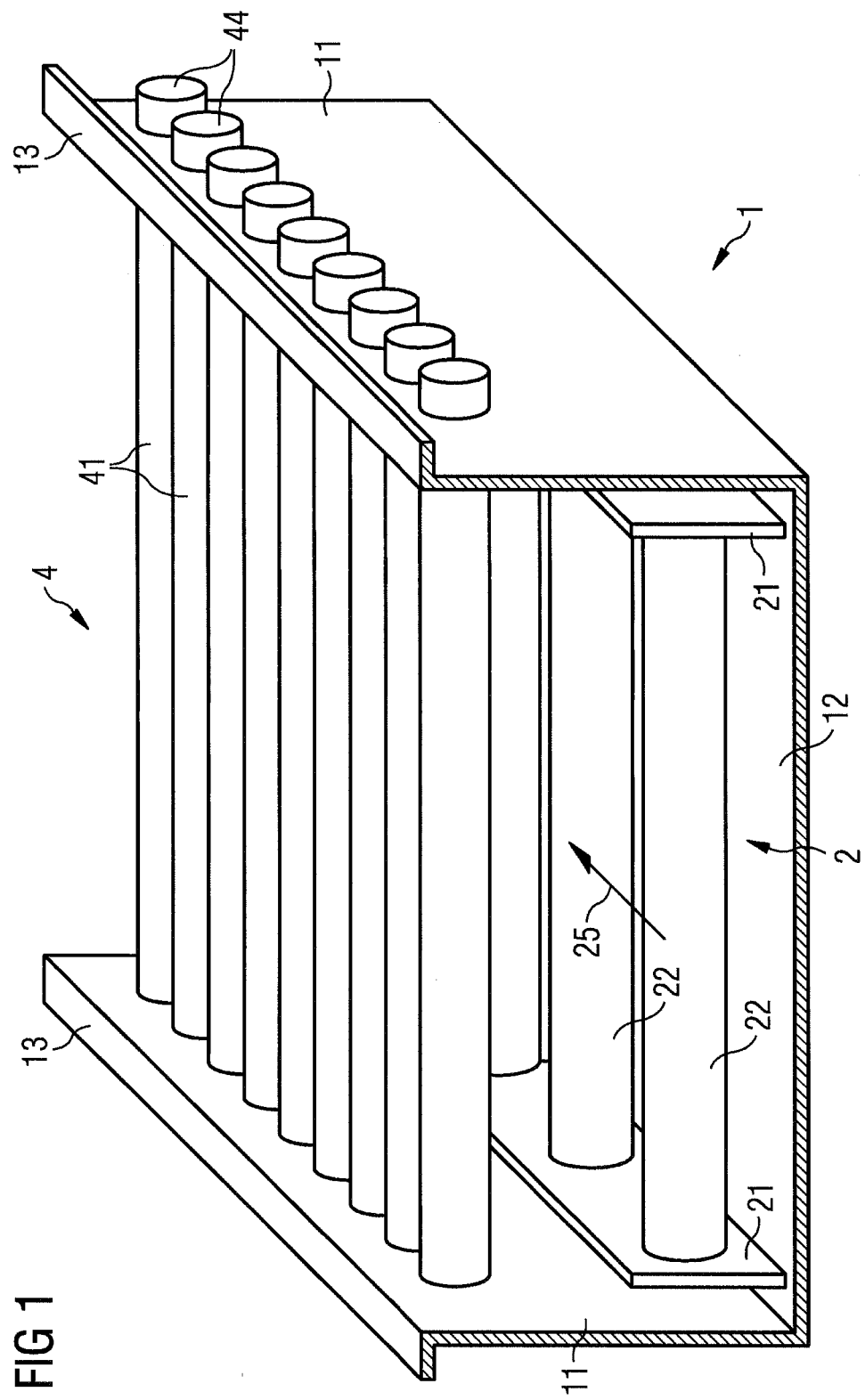

| EP | 0 848 575 A1 | 6/1998 |
| JP | 2009 046599 A | 2/2009 |
| WO | 98/36439 A2 | 8/1998 |
| WO | 01/35699 A1 | 5/2001 |

OTHER PUBLICATIONS

International Search Report dated Jul. 13, 2012 for corresponding PCT application No. PCT/EP2012/057765.

\* cited by examiner

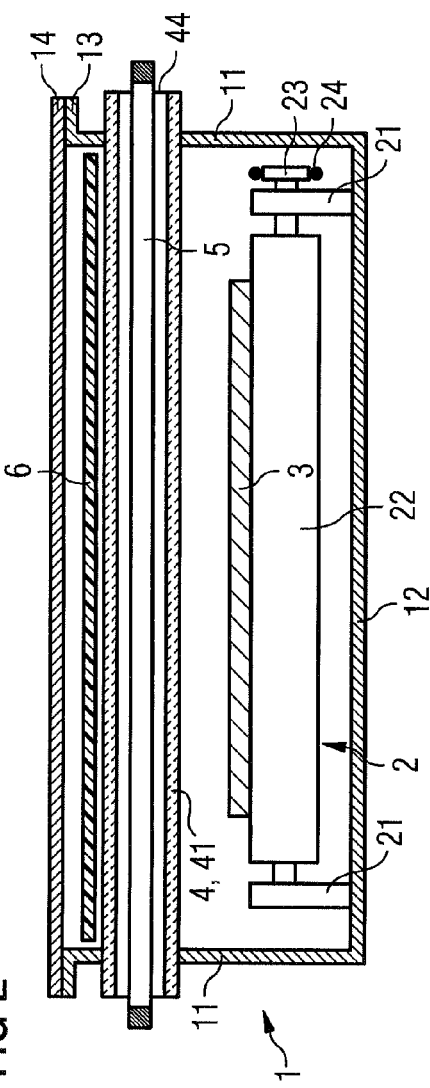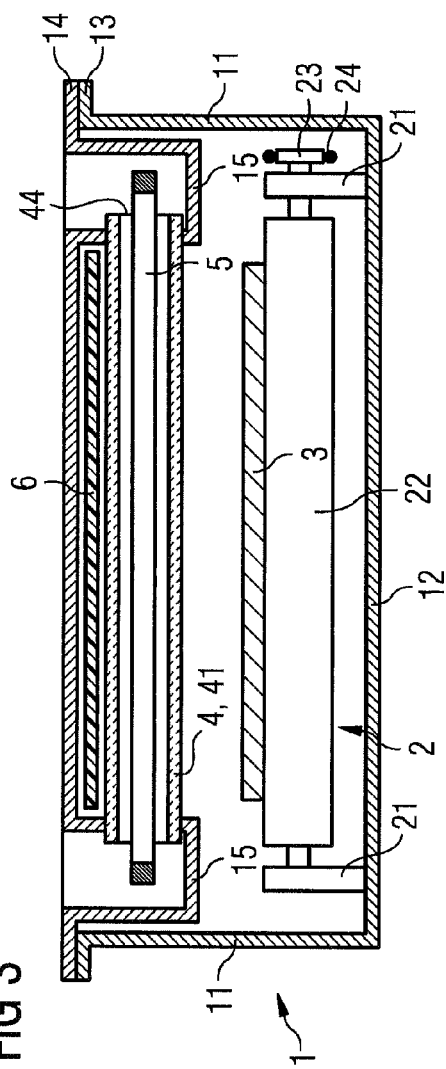

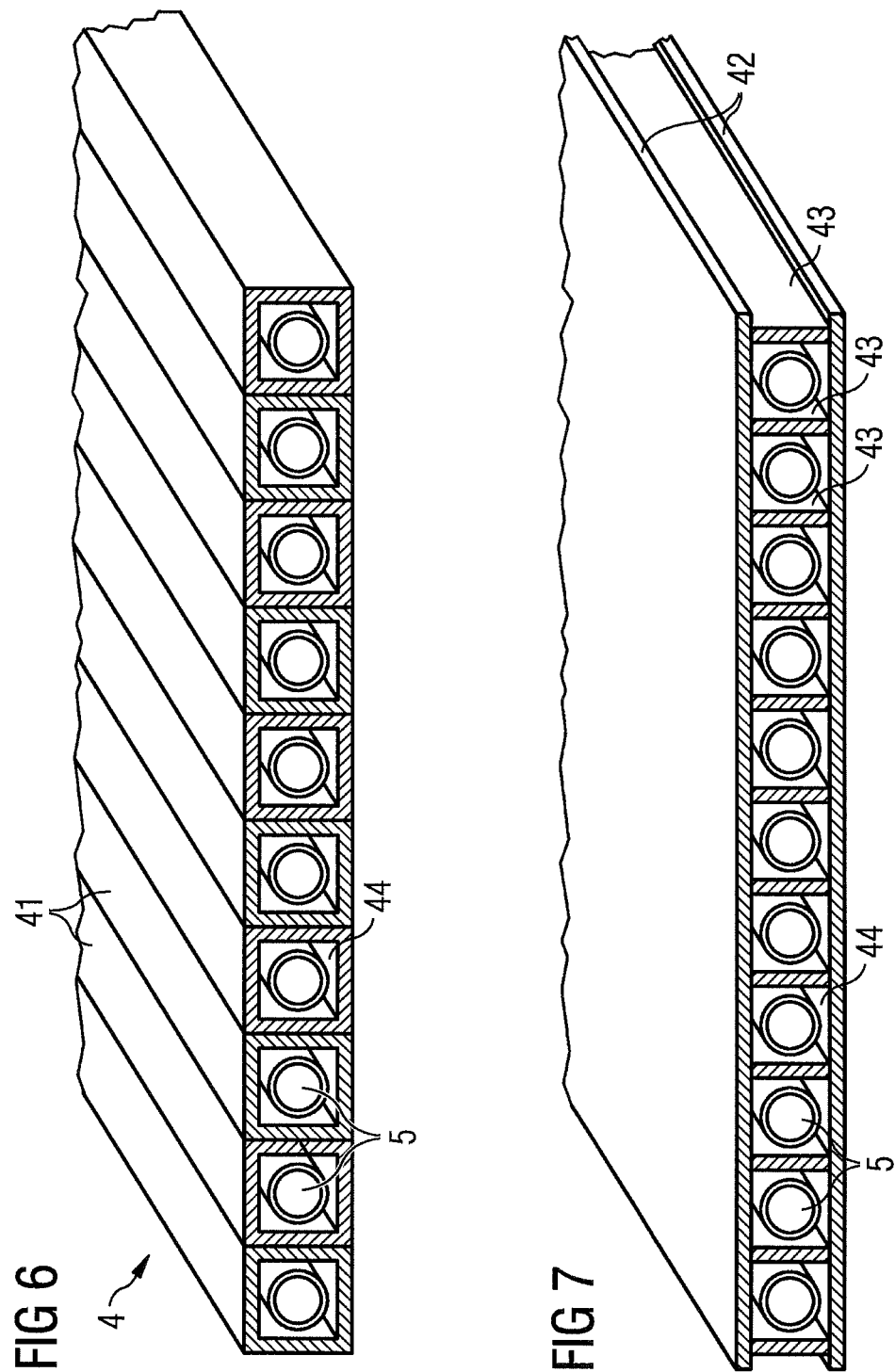

SUBSTRATE TREATMENT INSTALLATION

CROSS REFERENCE TO RELATED APPLICATIONS

This application is a national stage filing under section 371 of International Application No. PCT/EP2012/057765, filed on Apr. 27, 2012, and published in German on Nov. 1, 2012, as WO 2012/146715 A1 and claims priority of German applications No. 10 2011 100 098.8 filed on Apr. 29, 2011, and No. 10 2011 081 749.2 filed on Aug. 29, 2011, the entire disclosure of these applications being hereby incorporated herein by reference.

BACKGROUND ART

The invention relates to a substrate treatment installation.

If exposure or heat-treatment processes are intended to be carried out with the aid of pulsed gas discharge lamps (flash lamps) on large substrates, that is to say for example with a surface area of about 1 m² or more, this can be achieved in two ways: one is for a single lamp (or a small array of lamps which cover only a part of the substrate) to be moved relative to the substrate so that the entire substrate can ultimately be exposed or heat-treated by combining a plurality of exposure fields. As an alternative to this, an array of lamps which extends over the entire substrate may be ignited once. There are many examples—such as photoresists to be exposed on a substrate—in which a combination of a plurality of exposure fields necessarily leads to a detrimental double exposure owing to their necessary overlap. In these cases, it is only possible to use an array of lamps which cover the entire substrate.

An air-cooled lamp array which covers all or parts of the substrate surface is prior art. In processes which can or should only take place in a vacuum, lamps are arranged outside the vacuum chamber and the substrate is exposed or heat-treated through an optical window in the wall of the vacuum chamber, through which the lamps shine into the vacuum chamber. Owing to the pressure difference between the atmospheric pressure outside the installation and the vacuum prevailing inside the installation, the optical window is therefore exposed to a force of at least $10^5$ newtons per square meter of substrate surface. The optical window would consequently need to be made correspondingly thick—that is to say many centimeters. Apart from the high production costs of this specially manufactured glass (typically quartz glass owing to the high transparency in the UV range), a significant part of the light from the lamp is absorbed in the glass of the optical window owing to the large thickness of the glass, in order to achieve the required strength.

In the case of lasers which are used for boring turbine blades, for example, a 200 mm long gas discharge lamp is used as the light source. Owing to the high flash frequency, for example 500 pulses per second, i.e. a relatively high average electrical power of for example 8 kW, the lamp needs to be water-cooled. The cooling is generally carried out by a so-called flow tube, in which the lamp is embedded. The flow tube is a quartz glass tube, through which deionized cooling water flows and therefore cools the lamp. Flow tubes permit turbulence-free water flow along the lamp.

US 2002/0148824 A1 proposes a system for the thermal treatment of surfaces of semiconductors, these being heated by thermal radiation generated by heating lamps. The lamps are in this case surrounded individually or in groups by locally transparent housings in order to isolate them from the ambient conditions of the treatment chamber, and optionally to cool them with suitable gaseous or liquid media. In addition, thin quartz glass sheets may also be arranged between the housings comprising the lamps and the surface to be thermally treated.

Similarly, US 2007/0095289 A1 discloses a heating device which can likewise be used for the thermal treatment of surfaces of semiconductors. The heating unit itself in this case consists of a bent quartz glass tube through which a carbon wire is fed, which, when an electrical current flows through it, generates heat and imparts it to the surface to be treated. The quartz tube is in this case mounted firmly on a reflector plate and is covered by a protective cover member consisting of silicon carbide.

It is an object of the present invention to improve known substrate treatment installations in such a way that substrates can be treated therein by light without cost-intensive optical windows with high weight being required.

BRIEF SUMMARY OF INVENTION

A substrate treatment installation is therefore proposed, which comprises an installation chamber and a light source for the exposure of substrates, wherein the light source is arranged inside the substrate treatment installation and comprises at least one lamp arranged in an at least locally optically transmissive housing having a vacuum-tight cavity for the reception of a lamp, as well as at least one reflector element which has an electrical connection and is arranged in spatial proximity to the at least one lamp.

The exposure of the substrates in the proposed substrate treatment installation is carried out in a manner such that, and with lamps such that, owing to their energy output, they are suitable for at least superficially modifying the substrate and/or a layer located thereon in respect of their properties, in a similar way as in the case of a thermal treatment process.

Owing to the arrangement of the lamp or lamps in a vacuum-tight housing, they can be arranged inside the installation chamber, with the result that specially manufactured optical windows of large thickness for lamps arranged outside the installation chamber can be obviated. This advantage is seen to be extremely positive particularly with increasing substrate sizes. Furthermore, owing to its arrangement inside the installation chamber, the light source in the proposed substrate treatment installation can be arranged much closer to the substrate, with the result that less energy is consumed in order to achieve the same effect as in the case of light sources lying outside the installation chamber.

It is furthermore proposed that at least one reflector element having an electrical connection, which makes it possible to place the reflector element at a selectable electrical potential, should be arranged in spatial proximity to the at least one lamp. This makes it possible to ignite even very long lamps simply and reliably.

According to one configuration, the housing of the light source comprises at least one tube made of an optically transmissive material. Tubes are easy and economical to produce, have a relatively high strength owing to their geometry even with relatively small wall thicknesses, and are ideally suitable for arranging a rod-shaped lamp therein. If a plurality of tubes are arranged mutually parallel in a plane, then an extensively illuminating light source can be provided in a simple and economical way inside the substrate treatment installation, in which a plurality of rod-shaped lamps can be arranged independently of one another and, at the same time, it is possible to expose large-surface planar, for example plate-shaped, substrates such as flat glass sheets and the like.

Alternatively, the housing may comprise at least two plates arranged mutually parallel and at least two plate strips connecting the plates, at least one plate consisting of an optically transmissive material. In principle, two plate strips are sufficient in order to connect the two parallel plates together to a housing, for example when the two ends, which are still open, of this assembly open outside the installation chamber, as will further be described below in connection with another configuration.

It may, however, also be expedient to insert further plate strips between the two plates, in order to further increase the strength of the housing, as will further be described below with the aid of an exemplary embodiment. In this way, a plurality of channels delimited from one another are then provided between the two parallel plates, and may for example respectively be used to receive a rod-shaped lamp.

As already indicated above, it may be advantageous for the housing to extend through at least one wall of the installation chamber and, on the outer side of the installation, to have at least one opening through which the cavity of the housing is accessible from outside the installation chamber. In this way, on the one hand, it is possible to replace individual lamps when necessary during operation of the substrate treatment installation, without the installation chamber needing to be aerated when a vacuum process is carried out therein, and in this way to avoid a cost-intensive shutdown of the substrate treatment installation.

On the other hand, the at least one opening may be formed as a coolant connection, with the result that a coolant can be fed through the housing in order to cool the lamp or lamps. In this case, the coolant may for example be a gas such as air or nitrogen, although it may also be a coolant such as deionized water or the like.

According to another configuration, the light source comprises at least two rod-shaped lamps arranged in a plane, and the reflector element comprises at least one electrically conductive or electrically conductively coated plate arranged in a plane parallel thereto. In this way, two or more lamps can be ignited by using a single extensively formed reflector element, with the result that the structure of the substrate treatment installation can be kept simple.

The reflector element may, according to another configuration, be a component of the housing, i.e. the reflector element may for example be formed by one of the plates or one or several plate strips of the housing, for example by forming these from an electrically conductive material.

Alternatively, the reflector element may be an electrically conductive layer which is applied on a component of the housing, for example a per se optically transmissive and electrically nonconductive plate or an optically transmissive and electrically nonconductive plate strip. It is likewise possible to apply the electrically conductive layer on a subregion of the surface of an optically transmissive and electrically nonconductive tube.

If, for example, a tube of optically transmissive material such as quartz glass or the like is sealed to long flash lamps, for example 1700 mm, and fed through a vacuum chamber, then even glass wall thicknesses of for example 1.5 mm are sufficient in order to withstand the vacuum pressure. In the case of a relatively low flash frequency in a lamp array, for example one pulse per ten seconds, i.e. a substrate is heat-treated every ten seconds, gas cooling is entirely sufficient. Cooling of the lamp, for example by water, which absorbs the albeit small but not inconsiderable infrared part of the emission spectrum of the lamp, may thus be obviated. Such tubes can be produced economically (for example €50/2 m). Furthermore, simple (water-free) lamp replacement is possible without aerating the vacuum chamber. For a higher energy input, however, the proposed solution also permits active cooling of the lamps with a liquid coolant, as already described above.

If the UV component of the emission spectrum is intended to be utilized, the lamps may be cooled by means of a closed nitrogen circuit through the housing and a heat exchanger without ozone formation. In processes in which a UV component is not necessary, it is prior art to prevent the ozone formation from affecting the luminous efficiency by cerium doping of the lamp body. This variant may, of course, also be used advantageously in the proposed substrate treatment installation.

BRIEF DESCRIPTION OF THE DRAWING FIGURES

Figure 4:
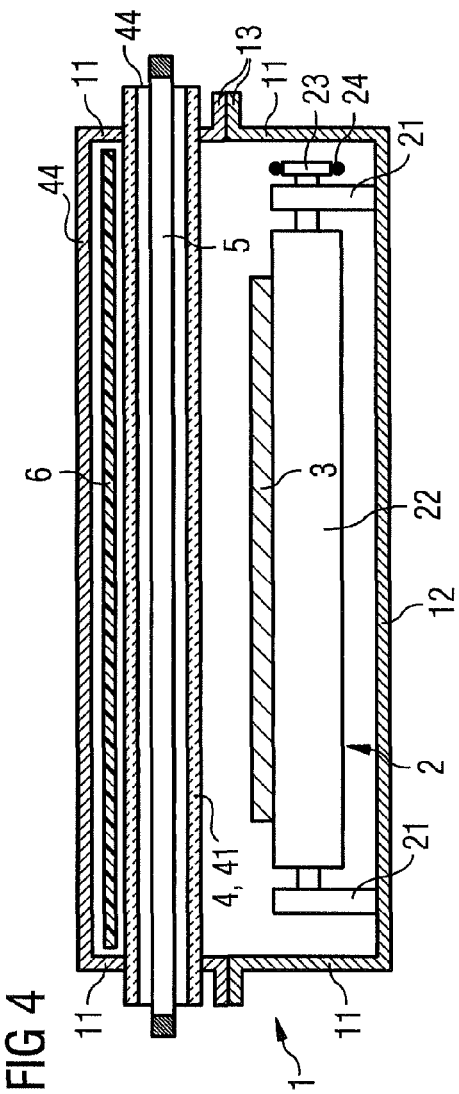
Figure 5:
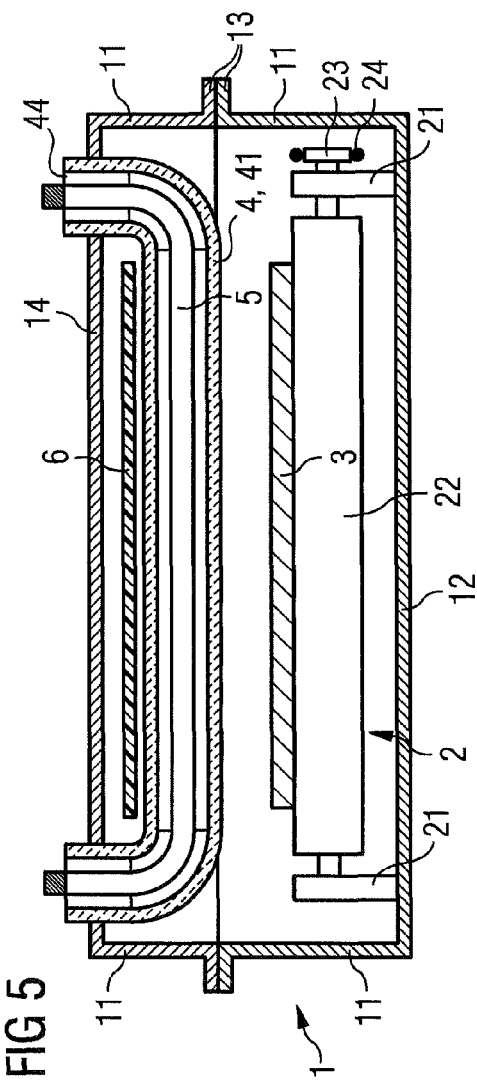

The proposed substrate treatment installation will be explained in more detail below with the aid of exemplary embodiments and associated figures, in which:

FIG. 1 shows an installation chamber belonging to a substrate treatment installation in perspective view with a lamp arrangement according to a first exemplary embodiment, FIG. 2 shows a cross-sectional view of a substrate treatment installation according to a second exemplary embodiment, FIG. 3 shows a cross-sectional view of a substrate treatment installation according to a third exemplary embodiment, FIG. 4 shows a cross-sectional view of a substrate treatment installation according to a fourth exemplary embodiment, FIG. 5 shows a cross-sectional view of a substrate treatment installation according to a fifth exemplary embodiment, FIG. 6 shows a lamp arrangement according to a sixth exemplary embodiment, FIG. 7 shows a lamp arrangement according to a seventh exemplary embodiment.

DETAILED DESCRIPTION

FIG. 1 shows a partial view of an installation chamber 1, which is part of a substrate treatment installation for the vacuum treatment of plate-shaped substrates. The installation chamber 1 comprises side walls 11, a bottom 12 and flanges 13, on which a cover (not represented here) can be placed so that the installation chamber 1 can be closed by the cover. A transport device 2 for the substrates 3 is arranged in the installation chamber 1. The transport device 2 is formed by an arrangement of transport rolls 22, which are arranged in a horizontal plane, are rotatably mounted in two bearing banks 21 and driveable, and on which the substrates to be treated are placed and moved in a transport direction 25 through the substrate treatment installation.

A section of the substrate treatment installation is shown, in which section the substrates are subjected to treatment by light. To this end, a lamp array is arranged in a plane above the transport device 2, which lamp array is arranged inside the installation chamber 1 below the cover (not represented here) which closes the installation chamber 1 during operation of the installation chamber 1 and is connected to the upper flange 13. To this end, transversely with respect to the transport direction 25 of the substrates, a plurality of quartz glass tubes 41 (flow tubes) are fed through the installation chamber 1 in a horizontal plane which is parallel to and above the transport plane of the substrates, and for example mounted in sealing rings, in such a way that they extend through the side walls 11 of the installation chamber 1. Atmospheric pressure therefore prevails in the tubes 41 even when the installation chamber 1 closed by a cover is evacuated during operation of the installation. These tubes 41 therefore form vacuum-tight containers 4, which are at least partially optically transmissive, for the lamps.

Lamps, which lead to the optical treatment of the substrates that are moved on the transport device 2 below the lamps through the substrate treatment installation, can then be fed through the tubes 41. In this way, it is possible both to install the lamps in atmospheric pressure and to cool the lamps with air, as well as to replace the lamps when necessary without the installation chamber 1 having to be aerated for this purpose. In this exemplary embodiment, the tubes 41 have a circular cross section. Therefore, on the one hand, the tubes 41 can be produced particularly simply and therefore economically, and on the other hand they are particularly pressure-resistant. In comparison with the optical window described above, the wall thickness of the tubes 41 does not scale with the number of lamps, and scales only slightly with their length owing to the required mechanical strength.

FIG. 2 shows a cross section through a substrate treatment installation of the type shown in FIG. 1, having a closed cover 14 which bears on the flanges 13 on the upper edges of the side walls 11 of the installation chamber 1, a reflector element 6 in the form of a plate being arranged above the arrangement of lamps 5 arranged in housings 4 of glass tubes 41. This reflector element 6 is used to ignite the lamps 5. In the case of long lamps 5, it is possible only with relatively high energy loss and/or elaborate electronics to achieve ignition of the gas discharge by applying a high voltage to the electrodes arranged at the ends of the respective lamp 5. External ignition through the reflector element 6 is substantially simpler to carry out, and furthermore permits DC isolation of the electrical supply of the lamp 5.

FIG. 3 shows an exemplary embodiment in which straight tubes 41 are mounted in recesses 15 of the cover 14, so that the tubes 41 and the lamps 5 arranged therein are in the vacuum inside the installation chamber 1, the ends of the tubes 41 opening into the atmosphere outside the installation chamber 1 and can be supplied with voltage there. The recesses 15 of the cover 14 therefore form walls of the installation chamber, through which the tubes extend. For easier replacement of the lamps 5, the recesses 15 may be connected releasably to the cover 14. The tubes 41 which open outside the installation chamber 1, and which respectively form a housing 4 for a lamp 5, may also be used for introduction and extraction of coolant owing to their externally lying openings 44. To this end, coolant connections may be arranged on the openings 44.

FIG. 4 shows an exemplary embodiment in which straight tubes 41 are mounted in the cover 14 of the installation chamber 1, so that they extend through its side walls 11 and the tubes 41 and the lamps 5 arranged therein are in the vacuum inside the installation chamber 1, the ends of the tubes 41 opening into the atmosphere outside the installation chamber 1 where they can be supplied with voltage.

FIG. 6 shows an extended arrangement of lamps 5 according to an exemplary embodiment, in which the tubes 41—unlike in the embodiments described above—are arranged in tubes 41 with a rectangular cross section. A small wall thickness of the tubes 41 can therefore be achieved, together with a high packing density of the lamps 5. The (horizontal) surfaces of the tubes 41 which face away from the substrates 3 as well as the (vertical) surfaces of the tubes 41 which lie between the lamps 5 may also be coated with an electrically conductive material, such as aluminum or the like. The coated surfaces, when an electrical potential is correspondingly applied thereto, can therefore constitute a reflector element 6 which can be used for ignition of the lamps 5, as described above. The same would moreover also be possible in the case of the cross-sectionally circular tubes 41 of the embodiments described above, although in this case only the parts of the lateral surface of the tubes 41 which face away from the substrates 3 should be coated, and the parts of the lateral surface of the tubes 41 facing toward the substrates 3 should remain optically transmissive.

FIG. 7 shows as a further alternative a lamp arrangement in a housing 4, which, in contrast to the tubes 41 proposed so far, can receive not just one lamp 5 but an entire extended arrangement of lamps 5. This housing 4 is formed from two plates 42, at least one of which consists of an optically transmissive material, for example quartz glass, and webs in the form of plate strips 43 which are arranged between the two plates 42 and are connected thereto, in order to increase the strength of the housing 4. The other plate 42 may likewise consist of an optically transmissive material such as quartz glass or the like, but may also consist of other materials, for example electrically conductive material such as aluminum or the like, or be coated with electrically conductive material such as aluminum or the like. In this case, the other plate may simultaneously constitute a capacitor element which can be used for ignition of the lamps 5, as described above. The same applies for the plate strips 43 arranged between the two plates 42.

In all exemplary embodiments, the components of the housing 4 which are coated or consist of conductive material may act simultaneously as reflectors, in order to utilize the light of the lamps 5 better.

The invention claimed is:

1. A substrate treatment installation, comprising an installation chamber and a light source for the exposure of substrates, wherein the light source is arranged inside the installation chamber and comprises at least one discharge lamp arranged in an at least locally optically transmissive housing having a vacuum-tight cavity for reception of the at least one discharge lamp, as well as at least one reflector element which has an electrical connection and is arranged in spatial proximity to the at least one discharge lamp.

2. The substrate treatment installation as claimed in claim 1, wherein the housing comprises at least one tube made of an optically transmissive material.

3. The substrate treatment installation as claimed in claim 1, wherein the housing comprises at least two plates arranged mutually parallel and at least two plate strips connecting the plates, at least one plate comprising an optically transmissive material.

4. The substrate treatment installation as claimed in claim 1, wherein the housing extends through at least one wall of the installation chamber and, on an outer side of the installation chamber, has at least one opening through which a cavity of the housing is accessible from outside the installation chamber.

5. The substrate treatment installation as claimed in claim 4, wherein the at least one opening comprises a coolant connection.

6. The substrate treatment installation as claimed in claim 1, wherein the light source comprises at least two rod-shaped discharge lamps arranged in a first plane, and the reflector element comprises at least one electrically conductive or electrically conductively coated plate arranged in a plane parallel to the first plane.

7. The substrate treatment installation as claimed in claim 1, wherein the reflector element comprises a component of the housing.

8. The substrate treatment installation as claimed in claim 1, wherein the reflector element comprises a metal layer applied on a component of the housing.

* * * * *